US009806434B2

(12) United States Patent
Aoyagi et al.

(10) Patent No.: US 9,806,434 B2
(45) Date of Patent: Oct. 31, 2017

(54) COAXIAL CABLE CONNECTION STRUCTURE

(71) Applicant: TATSUTA ELECTRIC WIRE & CABLE CO., LTD., Osaka (JP)

(72) Inventors: Yoshihiko Aoyagi, Kyoto (JP); Yoshinori Kawakami, Osaka (JP); Yoshio Hirano, Kyoto (JP); Kiyotaka Urashita, Kyoto (JP); Ryota Fujikawa, Kyoto (JP); Nobuhiro Fujio, Kyoto (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

(21) Appl. No.: 15/521,801

(22) PCT Filed: Oct. 29, 2015

(86) PCT No.: PCT/JP2015/080614
§ 371 (c)(1),
(2) Date: Apr. 25, 2017

(87) PCT Pub. No.: WO2016/068259
PCT Pub. Date: May 6, 2016

(65) Prior Publication Data

US 2017/0250476 A1 Aug. 31, 2017

(30) Foreign Application Priority Data

Oct. 29, 2014 (JP) ................................ 2014-220864

(51) Int. Cl.
*H01R 4/00* (2006.01)
*H01R 4/02* (2006.01)
(Continued)

(52) U.S. Cl.
CPC ............... *H01R 4/02* (2013.01); *H01R 12/53* (2013.01); *H05K 3/34* (2013.01); *H01B 7/00* (2013.01); *H05K 1/18* (2013.01)

(58) Field of Classification Search
CPC . H01R 4/02; H01R 12/53; H05K 3/34; H05K 1/18; H01B 7/00
(Continued)

(56) References Cited

U.S. PATENT DOCUMENTS 5,139,448 A * 8/1992 Seidler .............. H01L 23/49811 29/860
5,797,765 A * 8/1998 Barnett .................. H01R 24/50 333/260
(Continued)

FOREIGN PATENT DOCUMENTS

JP 10112580 A2 4/1998
JP 2012174484 A2 9/2012
(Continued)

OTHER PUBLICATIONS

International Search Report dated Dec. 15, 2016 filed in PCT/JP2015/080614.

*Primary Examiner* — Sherman Ng
(74) *Attorney, Agent, or Firm* — Rankin, Hill & Clark LLP

(57) ABSTRACT

A core wire of a coaxial cable is easily placed and soldered onto a conductive joint portion. Conductive joint portions 2 are formed at a predetermined interval on a substrate 1. A solder resist portion 5 is formed on each side of the conductive joint portion 2. A core wire 41 of a coaxial cable 4 is housed between two of the solder resist portions 5. A core wire 41 is placed on an upper surface 2*a* of the conductive
(Continued)

joint portion 2. In this state, the core wire 41 is, by solder 3, connected to the upper surface **2*a* of the conductive joint portion 2**.

4 Claims, 7 Drawing Sheets

(51) Int. Cl.
*H01R 12/53* (2011.01)
*H05K 3/34* (2006.01)
*H05K 1/18* (2006.01)
*H01B 7/00* (2006.01)

(58) Field of Classification Search
USPC .......................................... 174/84 R; 439/874
See application file for complete search history.

(56) References Cited

U.S. PATENT DOCUMENTS

| | | | | |
|---|---|---|---|---|
| 2011/0306235 | A1* | 12/2011 | Tanaka | H01R 4/027<br>439/578 |
| 2012/0214359 | A1 | 8/2012 | Yamada | |

FOREIGN PATENT DOCUMENTS

| | | | |
|---|---|---|---|
| JP | 5479432 | B2 | 4/2014 |
| JP | 2014089902 | A2 | 5/2014 |

* cited by examiner

COAXIAL CABLE CONNECTION STRUCTURE

TECHNICAL FIELD

The present invention relates to a connection structure for connection of a core wire of a coaxial cable with a printed circuit board.

BACKGROUND ART

A coaxial cable is used for connection between electronic devices such as mobile terminals and connection between electronic substrates of mobile terminals, for example (e.g., Patent Document 1). A core wire of the coaxial cable can be soldered to conductive joint portions of the substrates for electric connection between the electronic devices and electric connection between the electronic substrates.

In recent years, a higher-density circuit board and a miniaturized wiring pattern have been developed with size reduction and multi-functionalization of an electronic device. In response, extremely-thin coaxial cables are arranged at an extremely-narrow pitch.

CITATION LIST

Patent Literature

Patent Document 1: Japanese Patent No. 5479432

SUMMARY OF THE INVENTION

Problems to be Solved by the Invention

However, a core wire in an extremely-thin coaxial cable is extremely thin. Such a core wire is easily deformable due to weight reduction. For this reason, it is difficult to place the core wire on a conductive joint portion of a substrate.

Thus, the present invention is intended to provide a structure configured so that a core wire of a coaxial cable can be easily placed and soldered onto a conductive joint portion.

Solutions to the Problems

The present invention relates to a coaxial cable connection structure to which a core wire of a coaxial cable is soldered. The coaxial cable connection structure includes a conductive joint portion having a joint surface soldered to a side peripheral surface of the core wire, and solder resist portions protruding beyond the joint surface at both end portions of the conductive joint portion in a width direction.

According to the above-described configuration, protrusion of the solder resist portions arranged at both ends of the joint surface of the conductive joint portion allows positioning of the core wire on the joint surface in the state in which the core wire is housed between the solder resist portions when the core wire contacts or comes close to the joint surface of the conductive joint portion. As a result, even when the core wire of the coaxial cable is easily reduced in weight and is easily deformable due to the extremely-small thickness of the core wire, the core wire can be easily and efficiently soldered to the joint surface of the conductive joint portion.

Moreover, in the above-described connection structure, the width between the solder resist portions facing each other with the joint surface being interposed therebetween is preferably set to the most-expanded width at a protruding top of each solder resist portion.

According to the above-described configuration, when the core wire is housed between the solder resist portions while moving toward the joint surface of the conductive joint portion, the core wire can deform to the expanded width in the width direction of the core wire. Thus, workability and a yield ratio can be improved.

Further, in the above-described connection structure, the width between the solder resist portions facing each other with the joint surface being interposed therebetween is preferably set to the most-expanded width at an end portion of the joint surface in a longitudinal direction.

According to the above-described configuration, when the core wire initially moves toward the joint surface from an end portion side with the most-expanded width, the core wire can deform to the expanded width in the width direction of the core wire. Thus, the workability and the yield ratio can be improved.

In addition, in the above-described connection structure, the protrusion length of each solder resist portion is preferably longer than the sum of the height of the conductive joint portion and the radius of the core wire. The "protrusion length of each solder resist portion" as described herein is the length of the solder resist portion from the height of the joint surface of the conductive joint portion to the protruding top.

According to the above-described configuration, even when a certain level of external force such as vibration or an air flow is applied after the core wire has moved to the joint surface of the conductive joint portion and has housed between the solder resist portions, a defect leading to misalignment of the position of the core wire due to movement of the core wire over the solder resist portion can be reduced.

Effects of the Invention

According to the present invention, the core wire of the coaxial cable can be disposed on the joint surface with the core wire being housed between the solder resist portions. Thus, the core wire can be easily soldered onto the joint surface of the conductive joint portion.

DESCRIPTION OF THE EMBODIMENTS

Preferable embodiments of the present invention will be described below with reference to drawings.

First Embodiment (Coaxial Cable Connection Structure)

A coaxial cable connection structure of the present embodiment is a structure to which a core wire of a coaxial cable is soldered. The present structure includes a conductive joint portion having a joint surface soldered to a side peripheral surface of the core wire, and solder resist portions protruding beyond the joint surface at both end portions of the conductive joint portion in a width direction. Specific description will be made below with reference to FIGS. 1A and 1B.

<Printed Circuit Board>

Figure 1A:
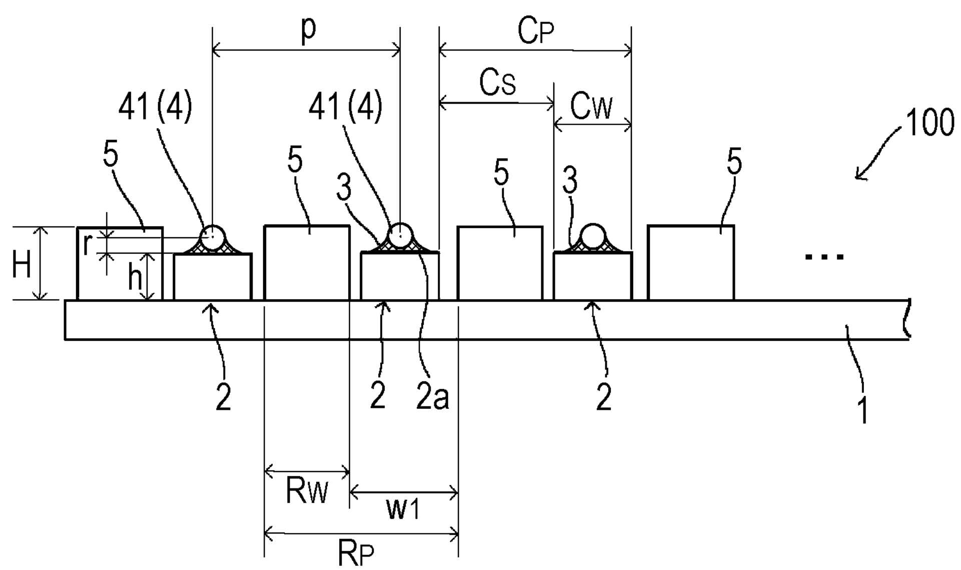
FIG. 1A is a front view of a printed circuit board employing a connection structure of a first embodiment.

As illustrated in FIG. 1A, a printed circuit board 100 includes a substrate 1 and a plurality of conductive joint portions 2 formed on the substrate 1. Core wires 41 of coaxial cables 4 are, with solder 3, connected respectively onto upper surfaces (joint surfaces) 2*a* of the conductive joint portions 2. Solder resist portions 5 are formed respectively on right and left sides of each conductive joint portion 2.

<Conductive Joint Portion>

Figure 1B:
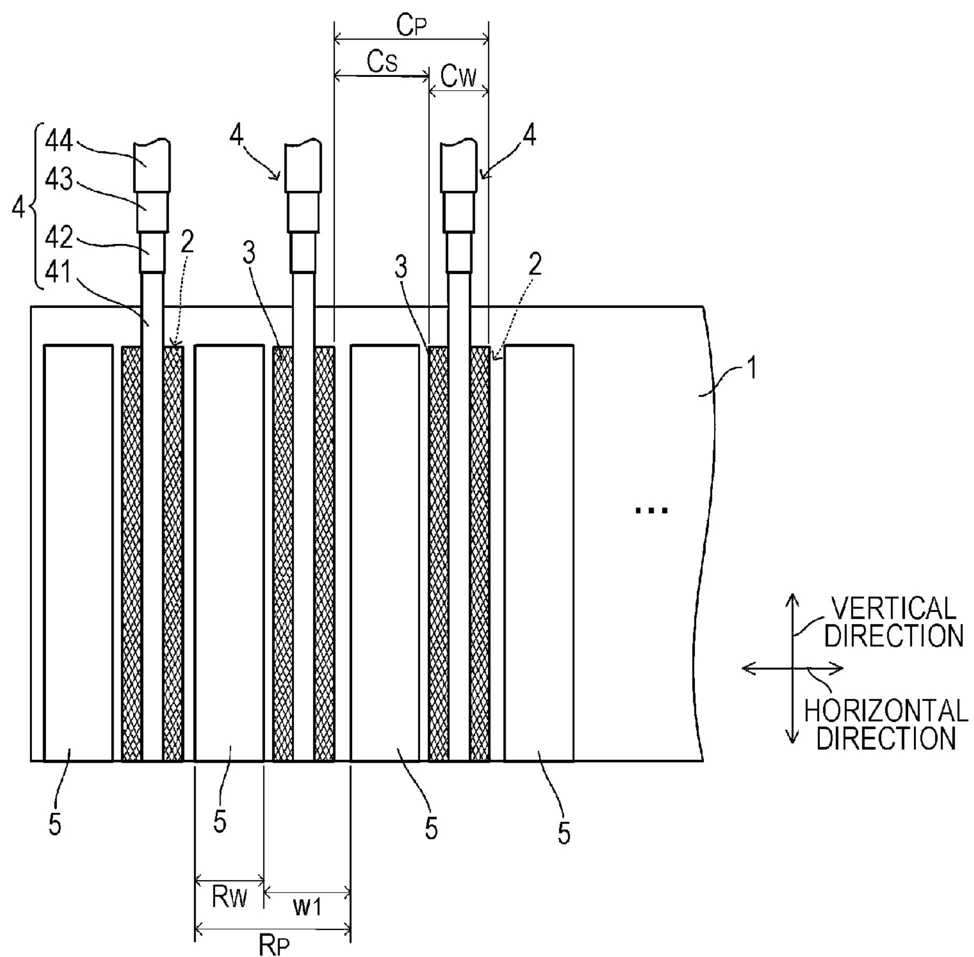
FIG. 1B is a plan view of the printed circuit board employing the connection structure of the first embodiment.

The conductive joint portions 2 are arranged at a predetermined pitch. The upper surface 2*a* of the conductive joint portion 2 is the joint surface joined to the core wire 41 of the coaxial cable 4. The solder 3 is applied to the entirety of the upper surface 2*a*. As illustrated in FIG. 1B, the conductive joint portion 2 extends in a straight line in the vertical direction. The width Cw of the conductive joint portion 2 is, e.g., 50 μm to 200 μm. The pitch Cp of the conductive joint portion 2 is, e.g., 100 μm to 400 μm. With the conductive joint portion 2 having the above-described with, the core wire 41 can be favorably connected to the conductive joint portion 2. With the conductive joint portions 2 arranged at the above-described pitch, a fillet can be formed in a favorable shape. As a result, the strength of connection between the conductive joint portion 2 and the core wire 41 can be maintained at a predetermined strength.

The pitch Cp of the conductive joint portion 2 as described herein is the total of the width Cw of the conductive joint portion 2 and the space Cs between the conductive joint portions 2. The space Cs between the conductive joint portions 2 is a spacing between adjacent two of the conductive joint portions 2 sandwiching the solder resist portion 5.

The conductive joint portion 2 is formed by, e.g., etching of the substrate 1. Moreover, the conductive joint portion 2 may be formed in such a manner that a conductive material such as silver or copper printed on the substrate 1 is burned.

<Coaxial Cable>

As illustrated in FIG. 1B, the coaxial cable 4 includes the columnar core wire 41, an internal insulator 42 covering the core wire 41, an external conductor 43 covering the internal insulator 42, and an external insulator 44 as the outermost layer. A side peripheral surface of the core wire 41, particularly a lower half surface of the core wire 41, is joined to the upper surface 2*a* of the conductive joint portion 2 with the solder 3 (see FIG. 1A). An upper half surface of the core wire 41 is exposed. A conductive wire member with a diameter of equal to or greater than 15 μm and equal to or less than 100 μm can be used as the core wire 41, for example. The pitch p of the core wire 41 is equal to or greater than 100 μm and equal to or less than 400 μm, for example.

<Solder Resist Portion>

As illustrated in FIG. 1A, the solder resist portions 5 protrude from an upper surface of the substrate 1. Moreover, the solder resist portion 5 is higher than the upper surface (the joint surface) 2*a* of the conductive joint portion 2. When the substrate 1 is in a planar shape, the protrusion length H of the solder resist portion 5 is longer than the sum of the height (the thickness) h of the conductive joint portion 2 and the radius r of the core wire 41 ($H>h+r$). The protrusion length H of the solder resist portion 5 as described herein is a length from the upper surface of the substrate 1 to the protruding top of the solder resist portion 5.

As illustrated in FIG. 1B, the solder resist portion 5 extends in a straight line parallel to the vertical direction. The spacing (the space) between adjacent two of the solder resist portions 5 sandwiching the conductive joint portion 2 is the same length (the same width) w1 at any positions in a longitudinal direction (see FIGS. 1A and 1B). The width Rw of the solder resist portion 5 is equal to or greater than 50 μm and equal to or less than 200 μm, for example. The pitch Rp of the solder resist portion 5 is equal to or greater than 100 μm and equal to or less than 400 μm, for example. The pitch Rp of the solder resist portion 5 is the total of the width Rw of the solder resist portion 5 and the space w1 between adjacent ones of the solder resist portions 5.

The solder resist portion 5 is formed by, e.g., etching of the substrate 1. In this state, the width Rw of the solder resist portion 5 is preferably set to equal to or greater than 50 μm and equal to or less than 200 μm. Moreover, the space w1 is preferably set to equal to or greater than 50 μm and equal to or less than 200 μm. The width Rw of the solder resist portion 5 and the space w1 between the solder resist portions 5 can be adjusted in such a manner that a light diameter in UV irradiation, light distribution, an irradiation position, an irradiation time, a light intensity, etc. are changed. Moreover, the width Rw of the solder resist portion 5 and the space w1 between the solder resist portions 5 can be also adjusted in such a manner that a pattern width is adjusted in etching of the substrate 1.

Note that the width Rw of the solder resist portion 5 is more preferably equal to or greater than 60 μm and equal to or less than 120 μm, and much more preferably equal to or greater than 100 μm and equal to or less than 120 μm. Moreover, the space W1 between the solder resist portions 5 is more preferably equal to or greater than 40 μm and equal to or less than 80 μm. With such settings of the width Rw and the space w1, the area of contact between a bottom portion of the solder resist portion 5 and the substrate 1 can be increased. Thus, detachment of the solder resist portion 5 from the substrate 1 is reduced.

(Method for Manufacturing Printed Circuit Board)

Next, the method for manufacturing the printed circuit board 100 will be described with reference to FIGS. 2A to 2D.

Figure 2A:
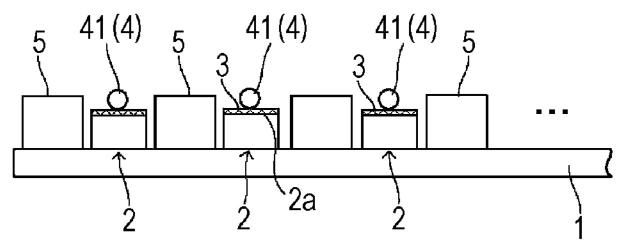
FIG. 2A is a schematic view of the process of placing a core wire on each conductive joint portion.

First, the core wire 41 is housed between adjacent two of the solder resist portions 5 as illustrated in FIG. 2A. Then, the core wires 41 is placed on the upper surface 2*a* of the conductive joint portion 2 (a conductive wire member setting process). Although the core wire 41 is housed between adjacent two of the solder resist portions 5 and accordingly deforms to expand in the width direction, such a core wire 41 can be positioned on the upper surface 2*a* of the conductive joint portion 2. The solder 3 is applied in advance onto the upper surfaces (the joint surfaces) 2*a* of the conductive joint portions 2.

Figure 2B:
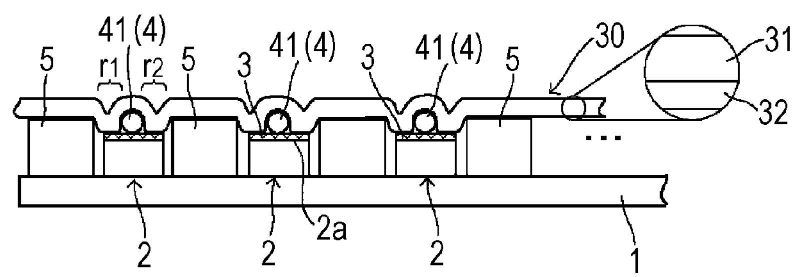
FIG. 2B is a schematic view of an optically-transparent sheet for holding a placement state of the core wire.

Next, the conductive joint portions 2, the solder 3, and the core wires 41 are covered with an optically-transparent sheet 30 (see FIG. 2B). In this state, the core wires 41 contact the solder 3. Moreover, the core wires 41 and the solder 3 are covered with the optically-transparent sheet 30 such that the core wires 41 do not deform or move. In FIG. 2B, the upper half of the side peripheral surface of the core wire 41 is covered with the optically-transparent sheet 30. Moreover, regions r1, r2 of the solder 3 on both sides of the core wire 41 are covered with the optically-transparent sheet 30. With this configuration, the state in which the core wire 41 is placed on the conductive joint portion 2 can be held such that the core wire 41 does not deform and move not only in an upper-to-lower direction but also in a right-to-left direction (a placement state holding process).

The optically-transparent sheet 30 includes a resin layer 31 made of polyimide, and an adhesive layer 32 formed below the resin layer 31 (see an enlarged view of FIG. 2B). The optically-transparent sheet 30 is, with the adhesive layer 32, bonded to the core wires 41 and the solder 3.

Note that the core wire 41 of the coaxial cable 4 is thin and lightweight. Thus, such a core wire 41 less contacts the conductive joint portion 2 by its own weight. Moreover, the core wire 41 tends to move or deform to a non-contact state with the conductive joint portion 2. However, since the core wire 41 is housed between adjacent two of the solder resist portions 5, such a core wire 41 can be positioned on the upper surface 2*a* of the conductive joint portion 2. In addition, since the core wires 41 are covered with the optically-transparent sheet 30, such core wires 41 can be held in the state in which each core wire 41 is placed on the upper surface 2*a* of a corresponding one of the conductive joint portions 2.

An optically-transparent member might be placed only on the core wires 41. However, the core wire 41 is thin and lightweight. For this reason, such a core wire 41 tends to move or deform right and left to the non-contact state with the conductive joint portion 2. Moreover, the upper surface 2*a* of the conductive joint portion 2 tends to be raised in a curved shape. When the optically-transparent member is placed on the columnar core wires 41 placed on such upper surfaces 2*a*, the core wires 41 move or deform. For these reasons, in the present embodiment, the core wires 41, the solder 3 (the regions r1, r2), and the conductive joint portions 2 are covered with the optically-transparent sheet 30. With this configuration, the state in which the core wire 41 is placed on the conductive joint portion 2 can be held while movement and deformation of the core wire 41 can be reduced.

Figure 2C:
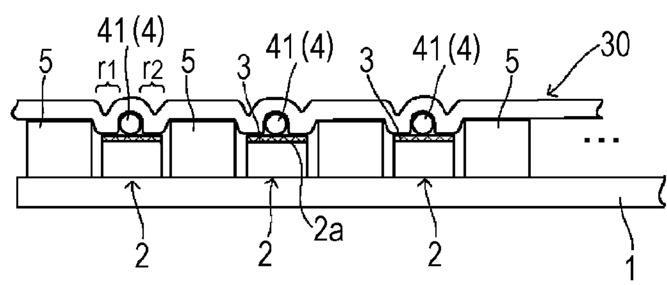
FIG. 2C is a schematic view of the process of joining the conductive joint portion and the core wire together.

Next, the optically-transparent sheet 30 is irradiated with light (see FIG. 2C). The solder 3 and the core wires 41 are irradiated with the light transmitted through the optically-transparent sheet 30. The solder 3 is melted by light energy. The light energy used for irradiation of the core wires 41 is also transmitted to the solder 3 below the core wires 41, thereby melting the solder 3. With this configuration, the core wire 41 is, with the solder 3, joined to the conductive joint portion 2 (a joint process). For example, laser light or infrared light may be irradiated as light. Subsequently, the optically-transparent sheet 30 is removed (see FIG. 2D), and in this manner, the connection structure of the present embodiment is provided (an optically-transparent sheet removal process).

Figure 2D:
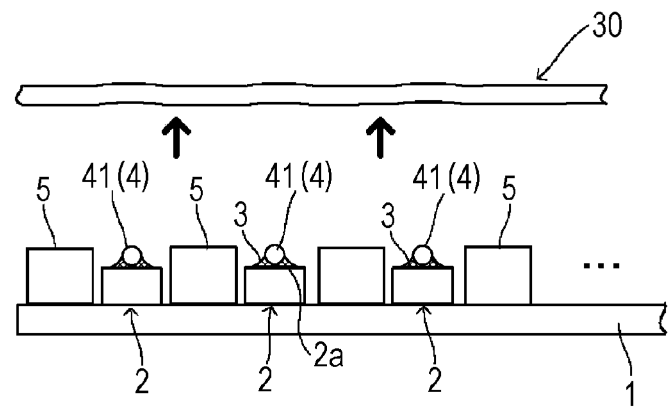
FIG. 2D is a schematic view of the process of removing the optically-transparent sheet.

As illustrated in FIG. 2D, the lower half of the side peripheral surface of the core wire 41 is soldered to the conductive joint portion 2. On the other hand, the upper half of the side peripheral surface of the core wire 41 is exposed. A partially-remaining portion (an adhesive) of the adhesive layer 32 of the optically-transparent sheet 30 might be stacked on such an exposed surface.

As described above, the coaxial cable connection structure of the present embodiment provides the following advantageous effects.

The core wire 41 of the coaxial cable 4 becomes easily deformable due to weight reduction as the core wire 41 becomes thinner. For this reason, the core wire tends to expand in the width direction. It is difficult to place such a core wire 41 on the upper surface (the joint surface) 2*a* of the conductive joint portion 2. However, in the above-described structure, the solder resist portions 5 protrude on both sides of the upper surface 2*a* of the conductive joint portion 2. Thus, the core wire 41 can be positioned and placed on the upper surface 2*a* in the state in which the core wire 41 is housed between adjacent ones of the solder resist portions 5. With this configuration, the easily-deformable core wire 41 of the coaxial cable 4 can be easily soldered to the upper surface 2*a* of the conductive joint portion 2. Moreover, in the above-described configuration, the core wire 41 can be connected to the conductive joint portion 2 with the core wire 41 being housed between adjacent ones of the solder resist portions 5. Thus, soldering is not performed manually, but can be performed mechanically. This improves workability.

The protrusion length H of the solder resist portion 5 is longer than the total of the height h of the conductive joint portion and the radius r of the core wire 41. Thus, even when external force due to, e.g., vibration or an air flow is applied with the core wire 41 being placed on the upper surface 2*a* of the conductive joint portion 2, there are no problems that the core wire 41 moves over the solder resist portion 5. Thus, a defect leading to misalignment of the position of the core wire 41 is reduced.

Further, in the above-described manufacturing method, the placement state of the core wire 41 on the conductive joint portion 2 is held by the optically-transparent sheet 30 while preliminary solder is heated and melted by light irradiation. In this manner, the core wire 41 and the conductive joint portion 2 are joined together. With this configuration, even when the core wire 41 is thin and is easily movable and deformable, movement and displacement of the core wire 41 can be prevented by coverage with the optically-transparent sheet 30 while the core wire 41 can contact the conductive joint portion 2. Thus, the core wire 41 can be joined to the conductive joint portion 2 with a high yield ratio. Moreover, the preliminary solder of the conductive joint portion 2 is melted, and in this manner, joining is performed using the solder from a contact surface side between the core wire 41 and the conductive joint portion 2. Thus, a solder bridge between adjacent ones of the conductive joint portions 2 is reduced as compared to a conventional case of performing the process of using a soldering iron to manually solder the core wire 41 from above. Consequently, short circuit due to the solder bridge can be reduced. Particularly when the pitch between adjacent ones of the conductive joint portions 2 is narrow, the frequency of occurrence of the bridge can be significantly reduced.

Moreover, the resin layer 31 made of polyimide resin is used for the optically-transparent sheet 30. The strength of such polyimide resin can be maintained at a melting temperature at which the preliminary solder is melted. Thus, the placement state of the core wire 41 can be held until completion of soldering.

Second Embodiment

Figure 3A:
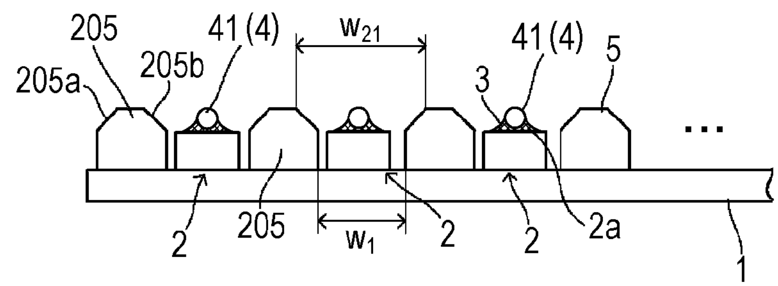
FIG. 3A is a front view of a printed circuit board employing a connection structure of a second embodiment.
Figure 3B:
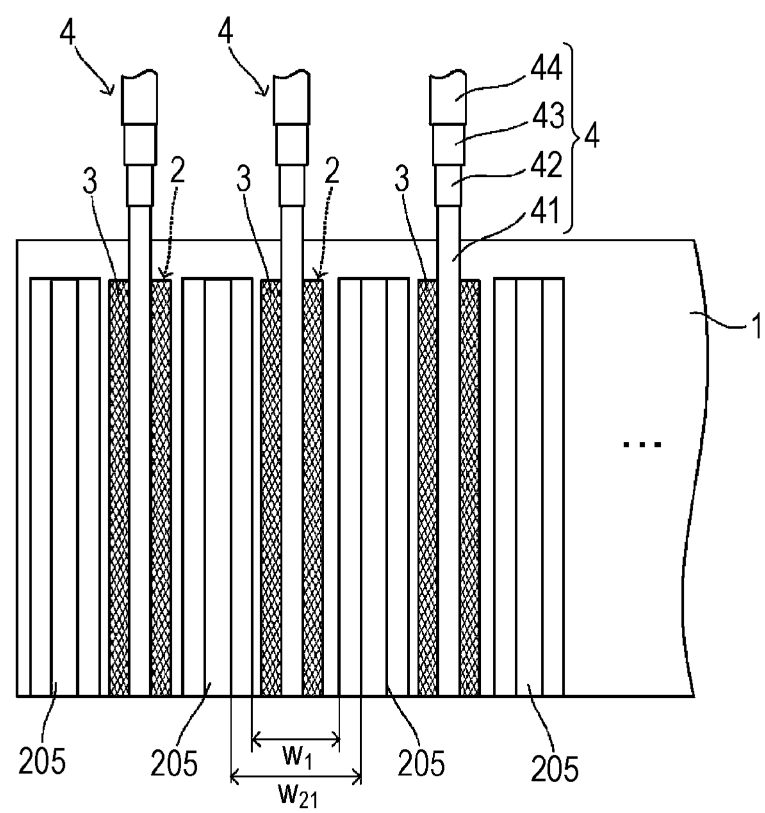
FIG. 3B is a plan view of the printed circuit board employing the connection structure of the second embodiment.

Next, a second embodiment of the present invention will be described with reference to FIGS. 3A and 3B. The second embodiment is different from the first embodiment in a configuration of a solder resist portion. Note that the same reference numerals as those of the above-described first embodiment are used to represent equivalent elements, and description thereof will be optionally omitted.

Each solder resist portion 205 is formed narrowed toward a protruding top (an upper end) thereof. A tapered portion 205*a*, 205*b* inclined to an opposing side surface as the tapered portion 205*a*, 205*b* extends toward the top is formed at each side surface of the solder resist portion 205. The tapered portions 205*a*, 205*b* are in a planar shape.

With the above-described configuration, the spacing (the space) between adjacent two of the solder resist portions 205 sandwiching a conductive joint portion 2 becomes larger toward the top. This spacing (this space) has the greatest width w21 at the top (the upper end) of the solder resist portion 205. This spacing (this space) has the smallest width w1 at a lower end of the solder resist portion 205. The width w21 is greater than the width w1.

In the present embodiment, the easily-deformable and easily-movable core wire 41 of each coaxial cable 4 can be, as in the first embodiment, easily soldered to the upper surface (the joint surface) 2*a* of the conductive joint portion 2. Moreover, the spacing (the space) between adjacent two of the solder resist portions 205 sandwiching the conductive joint portion 2 is greatest at the top. Thus, the core wire 41 expanded to the width w21 can be connected to the upper surface 2*a* of the conductive joint portion 2 with the core wire 41 being housed between adjacent ones of the solder resist portions 205. Consequently, workability and a yield ratio can be improved.

Third Embodiment

Figure 4A:
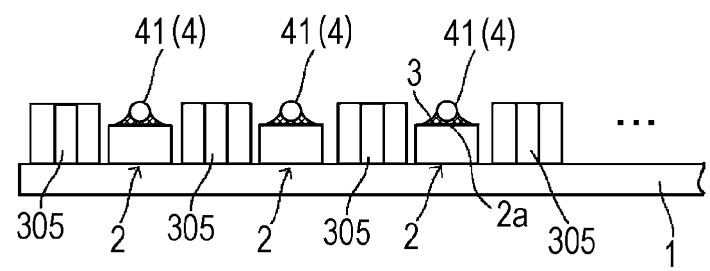
FIG. 4A is a front view of a printed circuit board employing a connection structure of a third embodiment.

Next, a third embodiment of the present invention will be described with reference to FIGS. 4A and 4B. The third embodiment is different from the first embodiment in a configuration of a solder resist portion. Note that the same reference numerals as those of the above-described first embodiment are used to represent equivalent elements, and description thereof will be optionally omitted.

Figure 4B:
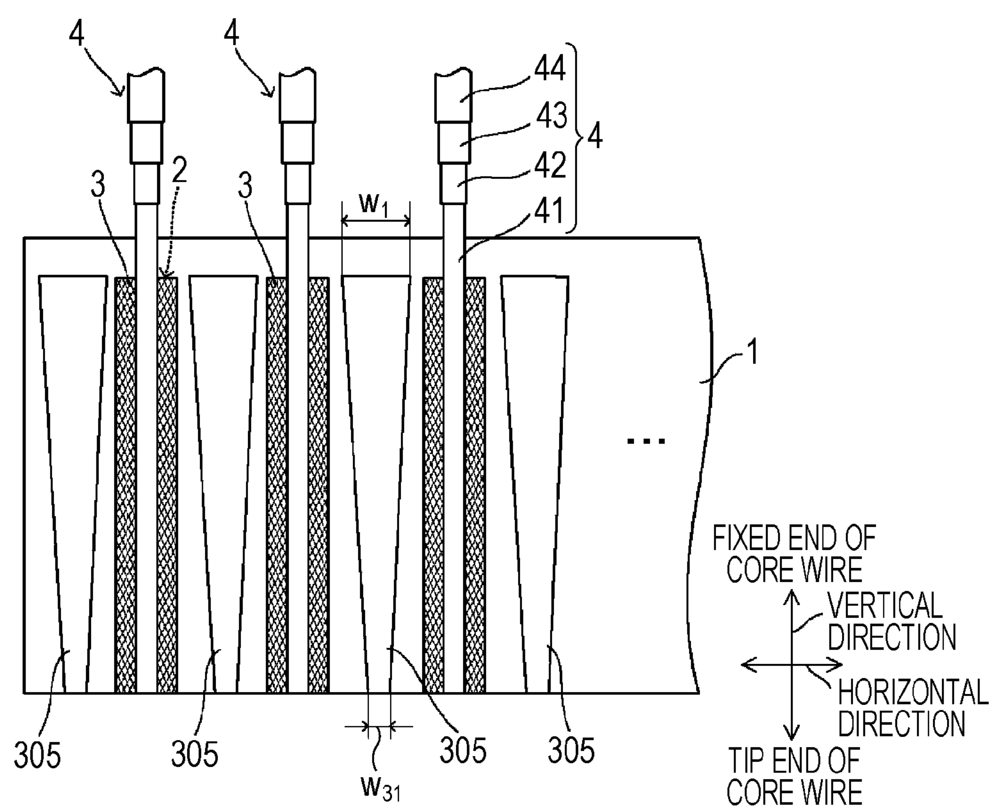
FIG. 4B is a plan view of the printed circuit board employing the connection structure of the third embodiment.

As viewed in the plane, each solder resist portion 305 is formed in a trapezoidal shape having a width narrowed with increasing distance from one end close to a base end of a core wire 41 in a longitudinal direction (see FIG. 4B). With this configuration, the spacing (the space) between adjacent two of the solder resist portions 305 sandwiching a conductive joint portion 2 is greater with increasing distance from one end close to a fixed end (the base end) of the core wire 41 in the longitudinal direction. The spacing (the space) between adjacent ones of the solder resist portions 305 has the shortest distance (the smallest space) w1 at one end close to the fixed end (the base end) of the core wire 41 in the longitudinal direction, and has the longest distance (the greatest space) w31 at the other end closest to a tip end of the core wire 41 in the longitudinal direction. The distance (the space) w31 is shorter than the distance (the space) w1.

In the present embodiment, the easily-deformable and easily-movable core wire 41 of each coaxial cable 4 can be, as in the first embodiment, easily soldered to an upper surface (a joint surface) 2*a* of the conductive joint portion 2. Moreover, the core wire 41 tends to deform and expand in a width direction with increasing distance from the fixed end (an upper end portion in FIG. 4B). However, in the above-described configuration, the distance (the space) between adjacent ones of the solder resist portions 305 is greater with increasing distance from the fixed end of the core wire 41. This distance (this space) increases to the maximum width w31 at the tip end of the core wire 41. Thus, even when the tip end of the core wire 41 is expanded to the width w31, the core wire 41 can be connected to the upper surface 2*a* of the conductive joint portion 2 with the core wire 41 being housed between adjacent ones of the solder resist portions 305. Consequently, workability and a yield ratio can be improved.

Fourth Embodiment

Figure 5A:
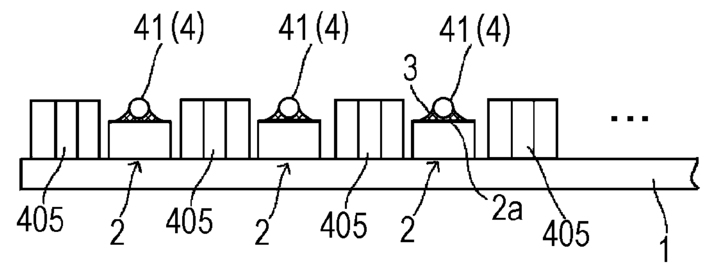
FIG. 5A is a front view of a printed circuit board employing a connection structure of a fourth embodiment.

Next, a fourth embodiment of the present invention will be described with reference to FIGS. 5A and 5B. The fourth embodiment is different from the first embodiment in a configuration of a solder resist portion. Note that the same reference numerals as those of the above-described first embodiment are used to represent equivalent elements, and description thereof will be optionally omitted.

Figure 5B:
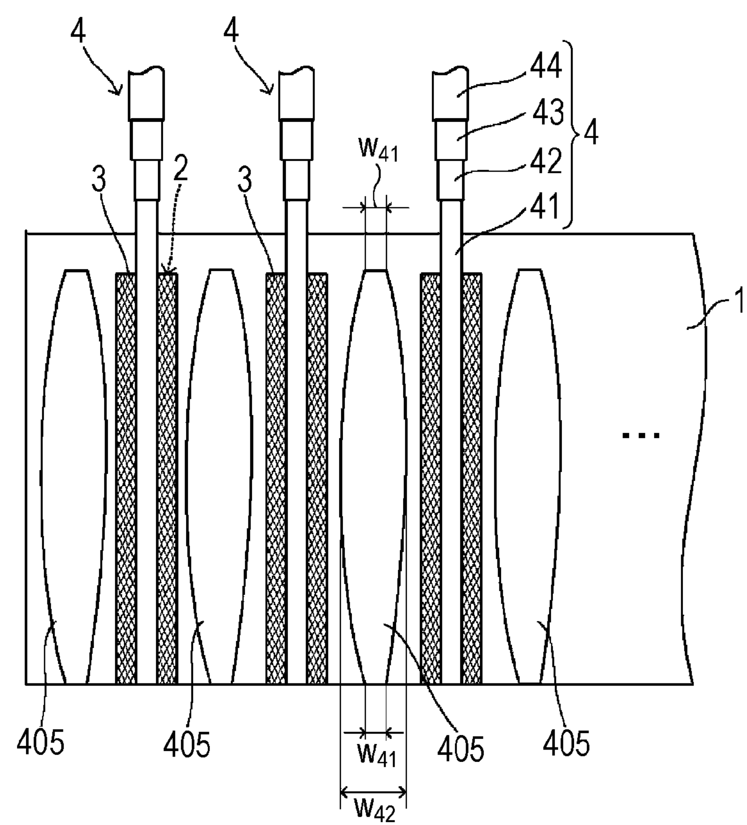
FIG. 5B is a plan view of the printed circuit board employing the connection structure of the fourth embodiment.

As viewed in the plane, each solder resist portion 405 is formed such that both side surfaces 405*a*, 405*b* are curved in an outwardly-raised shape (see FIG. 5B). The solder resist portion 405 is widest in the vicinity of the center thereof in a longitudinal direction. The spacing (the space) between adjacent two of the solder resist portions 405 sandwiching a conductive joint portion 2 is smallest in the vicinity of the center in the longitudinal direction, and increases with increasing distance from the vicinity of the center. Moreover, the spacing (the space) between adjacent two of the solder resist portions 405 is the shortest distance (the smallest space) w41 in the vicinity of the center of the solder resist portion 405 in the longitudinal direction, and is the longest (space) distance w42 at one and the other end portions of the solder resist portion 405 in the longitudinal direction. The distance w41 is shorter than the distance w42.

In the present embodiment, the easily-deformable and easily-movable core wire 41 of each coaxial cable 4 can be, as in the first embodiment, easily soldered to an upper surface (a joint surface) 2*a* of the conductive joint portion 2. Moreover, the core wire 41 tends to deform and expand in a width direction with increasing distance from a fixed end (an upper end portion in FIG. 5B). However, in the above-described configuration, the distance (the space) between adjacent ones of the solder resist portions 405 is greater with increasing distance from the fixed end of the core wire 41. This distance (this space) increases to the maximum width w41 at a tip end of the core wire 41. Thus, even when the tip end of the core wire 41 is deformed and expanded to the width w41, the core wire 41 can be connected to the upper surface 2*a* of the conductive joint portion 2 with the core wire 41 being housed between adjacent ones of the solder resist portions 505, 305. Moreover, the distance (the space) between adjacent ones of the solder resist portions 405 is great at both end portions in the longitudinal direction. Thus, the core wire 41 can be, without concerns about whether the position at which the core wire 41 is wide is on a tip end side (a fixed end side) or a base end side, housed with the core wire 41 inclining from the tip end side or the base end side. This improves workability.

Next, experiment for various widths Cw and spaces Cs for a conductive member and various widths Rw and spaces w1 for a solder resist will be described.

Conductive members and solder resists were formed by etching of a substrate, and in this manner, a structure (having no solder and no cores) illustrated in FIGS. 1A and 1B was provided. Ease of detachment of the solder resist was evaluated based on the following items:

Excellent: the solder resist was not detached from the substrate at all;

Good: the solder resist was not detached from the substrate; and

Poor: the solder resist was easily detached from the substrate.

The "Excellent" indicates less detachment as compared to the "Good." Note that the "Excellent" and the "Good" both indicate use without any problems.

Table 1 shows experimental conditions and evaluation results.

TABLE 1

| | Conductive Member | | Solder Resist | | |
|---|---|---|---|---|---|
| Experiment No. | Width Cw (μm) | Space Cs (μm) | Width Cw (μm) | Space Cs (μm) | Evaluation Result |
| 1 | 50 | 50 | 50 | 50 | Poor |
| 2 | 60 | 40 | 50 | 50 | Poor |
| 3 | 50 | 50 | 60 | 40 | Good |
| 4 | 100 | 100 | 100 | 100 | Good |
| 5 | 120 | 80 | 100 | 100 | Good |
| 6 | 100 | 100 | 120 | 80 | Excellent |

In the present experiment, the width Cw and the space Cs for the conductive member and the widths Rw, w1 of the solder resist were, in etching of the substrate, adjusted in such a manner that the width of light (in the present experiment, ultraviolet light was used) to be irradiated is adjusted.

In formation of the solder resist, when the irradiated light width increases, light intensity distribution expands according to the irradiated light width. Thus, it is considered that the range of hardening of the solder resist expands in a width direction and a depth direction.

In Experiment Nos. 1 and 2, the irradiated light width was set to equal to or less than 50 μm. In Experiment No. 3, the irradiated light width was set to 60 μm. In Experiment Nos. 4 to 6, the irradiated light width was set to equal to or greater than 100 μm. In Experiment No. 6, the irradiated light width was set to equal to or greater than 120 μm.

<Evaluation Results>

In Experiment Nos. 1 and 2, the irradiated light width was narrow. Thus, the intensity of light was insufficient. For this reason, the range of hardening of the solder resist was narrow, and the area of contact between the solder resist and the substrate was extremely small. Thus, it is considered that the solder resist is easily detached from the substrate.

On the other hand, in Experiment Nos. 3 to 6, the solder resist was not detached from the substrate. Thus, favorable results were provided. In Experiment Nos. 3 to 6, the above-described irradiated light width was set such that the range of hardening of the solder resist expands and that the area of contact between the solder resist and the substrate increases. This can ensure adhesion between the solder resist and the substrate. Thus, it is considered that a less-detachable structure is provided. Particularly in Experiment No. 6, high adhesion can be ensured.

With expansion of the range of hardening of the solder resist, the area of contact between the solder resist and the substrate increases. Thus, adhesion of the solder resist to the substrate can be ensured. Consequently, it is considered that a structure in which the solder resist is less detachable is provided.

Moreover, the printed circuit boards (having no solder and no cores) of Experiment Nos. 3 to 6 were observed. As a result of observation, the following shape difference was found as viewed from the front (the view illustrated in FIG. 1A).

In Experiment Nos. 3 to 5, the solder resist has a substantially semicircular shape raised toward the substrate.

On the other hand, in Experiment No. 6, the solder resist has a substantially trapezoidal shape. Moreover, the solder resist has a shape whose bottom surface length is slightly shorter than an upper surface length.

As described above, it has been found that there is a difference in the shape of the solder resist due to a change in the irradiated light width in etching.

When the solder resist is in the semicircular shape as in Experiment Nos. 3 to 5, the area of contact between the solder resist and the substrate slightly decreases. For this reason, adhesion of the solder resist to the substrate slightly decreases. On the other hand, in the case of the trapezoidal solder resist as in Experiment No. 6, the area of contact with the substrate slightly increases as compared to the case of the semicircular shape. Thus, adhesion of the solder resist to the substrate increases. In comparison between the solder resist of each of Experiment Nos. 3 to 5 and the solder resist of Experiment No. 6, the solder resist of Experiment No. 6 is less detachable from the substrate.

Note that in the second to fourth embodiments and a later-described variation, the solder resists having shapes different from that of the first embodiment are used. Note that such a shape difference has little relation to ease of detachment of the solder resist from the substrate. Thus, in the second to fourth embodiments and the variation, widths and spaces similar to those of Experiment Nos. 3 to 6 as described above are also set such that the structure in which the solder resist is less detachable is provided.

The embodiments of the present invention have been described above with reference to the drawings. Note that a specific configuration is not limited to these embodiments. The scope of the present invention is not defined by description made above, but by the scope of the appended claims. Further, all variations and equivalents which fall within the range of the appended claims are intended to be embraced therein.

For example, in the above-described second embodiment, the tapered portions 205*a*, 205*b* are formed respectively at both side surfaces of the solder resist portion 205. Note that the tapered portion may be formed only at one side surface. With this configuration, the distance (the space) between adjacent two of the solder resist portions 205 sandwiching the conductive joint portion 2 can be expanded while the number of processing of the solder resist portion 205 can be reduced.

Moreover, in the above-described second embodiment, the tapered portions 205*a*, 205*b* formed at the solder resist portion 205 are in the planar shape. Note that the tapered portion may be curved in a raised or recessed shape.

Further, in the above-described second embodiment, the tapered portions 205*a*, 205*b* are each formed across the entirety of the solder resist portion 205 in the longitudinal direction. Note that the tapered portion may be formed at a portion of the solder resist portion in the longitudinal direction.

In addition, in the above-described third embodiment, the distance (the space) between adjacent two of the solder resist portions 405 sandwiching the conductive joint portion 2 is shortest in the vicinity of the center in the longitudinal direction, and increases toward each end in the longitudinal direction. Note that the present embodiment is not limited to such a configuration. For example, in a certain configuration, the distance between adjacent two of the solder resist portions 405 sandwiching the conductive joint portion 2 may be longest in the vicinity of the center in the longitudinal direction, and may decrease toward each end in the longitudinal direction. In the case where both end portions of the core wire 41 in the longitudinal direction are fixed, the vicinity of the center of the core wire 41 is easily deformable. With employment of the above-described configuration, the workability and the yield ratio can be improved.

Moreover, in the above-described embodiments, all of the solder resist portions formed on the single printed circuit board have the same shape. Note that the solder resist portions may have different shapes. For example, the solder resist portions 5 of the first embodiment and the solder resist portions 205 of the second embodiment may be used on the single printed circuit board.

Further, in the above-described embodiments, polyimide resin is used for the resin layer of the optically-transparent sheet in the process of manufacturing the printed circuit board. Note that other types of resin may be used as long as such resin has a higher melting point than that of solder.

In addition, in the above-described embodiments, the solder is applied to the entirety of the upper surface of each conductive joint portion 2. Note that the solder may be applied to a portion of the upper surface of the conductive joint portion. In this case, the optically-transparent sheet 30 is, at the placement state holding process illustrated in FIG. 2B, preferably bonded to the substantially upper half of a center conductor 21, i.e., the exposed portion of the solder 3 and the exposed portion of the upper surface of each conductive joint portion 2. With this configuration, the state in which the center conductor 21 is placed on the conductive joint portion 2 can be more reliably held.

Figure 6A:
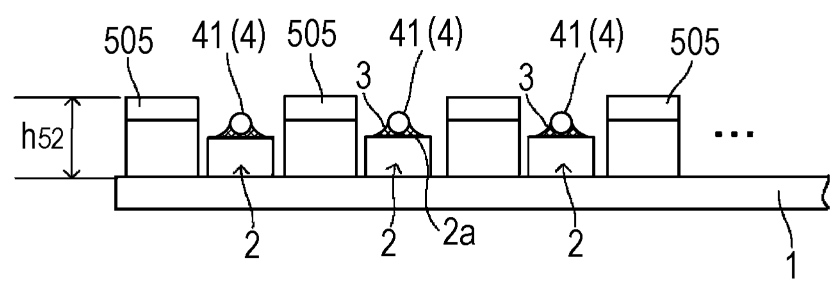
FIG. 6A is a front view of a printed circuit board employing a connection structure of a variation.
Figure 6B:
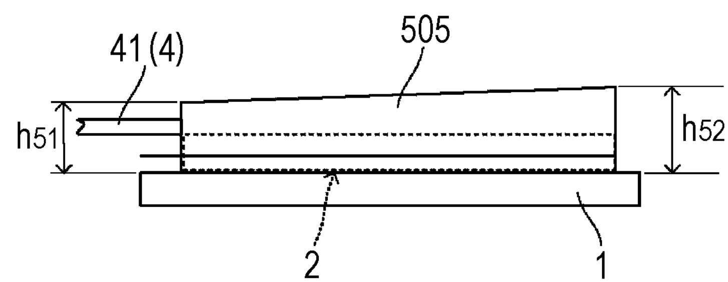
FIG. 6B is a side view of the printed circuit board employing the connection structure of the variation.

Moreover, in the above-described first to fourth embodiments, the height of the solder resist portion is uniform. Note that the height of the solder resist portion may vary. For example, as illustrated in FIGS. 6A and 6B, the protrusion height of the solder resist portion 505 may increase with increasing distance from the base end of the core wire 41 (the right side of FIG. 6B). The protrusion length of the solder resist portion 505 is the shortest protrusion length h51 at one end close to the base end of the core wire 41 in the longitudinal direction. Such a protrusion length is the longest protrusion length h52 at the other end close to the tip end of the core wire 41 in the longitudinal direction. The protrusion length h51 is shorter than the protrusion length h52. Moreover, the protrusion length h51 and the protrusion length h52 are both longer than the sum of the height of the conductive joint portion 2 and the radius of the core wire 41. Even with such a configuration, the advantageous effects of the present invention are also provided. Moreover, the core wire 41 tends to deform and expand in the width direction and the height direction with increasing distance from the fixed end (a left end portion in FIG. 6B). For this reason, when external force due to, e.g., vibration or an air flow is caused with the core wire 41 being housed between adjacent ones of the solder resist portions 505, a tip end portion (a right end portion in FIG. 6B) of the core wire 41 easily moves over the solder resist portion 505. However, in the above-described configuration, the solder resist portion 505 has a long protrusion length on the tip end side of the core wire 41. Thus, movement of the core wire 41 over the solder resist portion 505 is reduced on the tip end side. Consequently, a defect leading to misalignment of the position of the core wire 41 is reduced.

In FIGS. 6A and 6B, the height of the solder resist portion in the first embodiment is changed. Note that in the second to fourth embodiments, the height of the solder resist portion may be changed as in FIGS. 6A and 6B.

LIST OF REFERENCE NUMERALS

1 Substrate
2 Conductive joint portion
2*a* Upper surface
3 Solder
4 Coaxial cable
41 Core wire
5, 205, 305, 405, 505 Solder resist portion
205*a*, 205*b* Tapered portion
100 Printed circuit board

The invention claimed is:

1. A coaxial cable connection structure to which a core wire of a coaxial cable is soldered, comprising:

a conductive joint portion having a joint surface soldered to a side peripheral surface of the core wire; and solder resist portions protruding beyond the joint surface at both end portions of the conductive joint portion in a width direction, wherein, the width between the solder resist portions facing each other with the joint surface being interposed therebetween is set to the most-expanded width at an end portion of the joint surface in a longitudinal direction.

2. The coaxial cable connection structure according to claim 1, wherein a width between the solder resist portions facing each other with the joint surface being interposed therebetween is set to a most-expanded width at a protruding top of each solder resist portion.

3. The coaxial cable connection structure according to claim 1, wherein a protrusion length of each solder resist portion is longer than a sum of a height of the conductive joint portion and a radius of the core wire.

4. The coaxial cable connection structure according to claim 2, wherein a protrusion length of each solder resist portion is longer than a sum of a height of the conductive joint portion and a radius of the core wire.

* * * * *